United States Patent
Demos et al.

(10) Patent No.: US 7,790,583 B2
(45) Date of Patent: Sep. 7, 2010

(54) CLEAN PROCESS FOR AN ELECTRON BEAM SOURCE

(75) Inventors: Alexandros T. Demos, Fremont, CA (US); Khaled A. Elsheref, San Jose, CA (US); Josphine J. Chang, Carmichael, CA (US); Hichem M'saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/925,611

(22) Filed: Oct. 26, 2007

(65) Prior Publication Data

US 2008/0041415 A1     Feb. 21, 2008

Related U.S. Application Data

(63) Continuation of application No. 10/783,748, filed on Feb. 20, 2004, now Pat. No. 7,323,399.

(51) Int. Cl.
   *H01L 21/20* (2006.01)
(52) U.S. Cl. .......... 438/487; 438/905; 134/1.3; 134/57 R; 257/E21.134; 257/E21.224
(58) Field of Classification Search .......... 438/477, 438/487, 905, 780, 788, 790; 257/E21.134, 257/E21.224; 134/1.3, 57 R
See application file for complete search history.

(56) References Cited

U.S. PATENT DOCUMENTS

| | | | |
|---|---|---|---|
| 5,003,178 A | 3/1991 | Livesay | |
| 5,466,942 A | 11/1995 | Sakai et al. | |
| 5,539,211 A * | 7/1996 | Ohtoshi et al. | 250/441.11 |
| 5,981,960 A | 11/1999 | Ooaeh et al. | |
| 5,985,032 A | 11/1999 | Eriguchi | |
| 6,394,109 B1 | 5/2002 | Somekh | |
| 6,407,399 B1 * | 6/2002 | Livesay | 250/492.3 |
| 7,247,848 B2 * | 7/2007 | Nakasuji et al. | 250/306 |
| 2002/0053353 A1 * | 5/2002 | Kawata et al. | 134/1.3 |
| 2002/0063114 A1 | 5/2002 | Dopper | |
| 2003/0047691 A1 | 3/2003 | Musil et al. | |
| 2004/0018303 A1 | 1/2004 | Bruce et al. | |

* cited by examiner

*Primary Examiner*—Khiem D Nguyen
(74) *Attorney, Agent, or Firm*—Pillsbury Winthrop Shaw Pittman

(57) ABSTRACT

One embodiment of the present invention is a method for cleaning an electron beam treatment apparatus that includes: (a) generating an electron beam that energizes a cleaning gas in a chamber of the electron beam treatment apparatus; (b) monitoring an electron beam current; (c) adjusting a pressure of the cleaning gas to maintain the electron beam current at a substantially constant value; and (d) stopping when a predetermined condition has been reached.

12 Claims, 2 Drawing Sheets

CLEAN PROCESS FOR AN ELECTRON BEAM SOURCE

CROSS REFERENCE TO RELATED APPLICATIONS

This application is a continuation of U.S. patent application Ser. No. 10/783,748 filed on Feb. 20, 2004, now U.S. Pat. No. 7,323,399, which is incorporated by reference herein.

BACKGROUND

One or more embodiments of the present invention pertain to apparatus for electron beam treatment used to fabricate integrated circuit devices. In particular, one or more embodiments of the present invention pertain to method and apparatus for cleaning such apparatus.

Fabrication of integrated devices, for example, and without limitation. Semiconductor integrated devices, is complicated and, due to increasingly stringent requirements on device designs due to demands for greater device speed, fabrication is becoming ever more complicated. For example, integrated circuit geometries have decreased in size substantially since such devices were first introduced several decades ago. Since then, integrated circuits have generally followed a two year/half-size rule (often called Moore's Law), which means that the number of devices on a chip doubles every two years. Today's fabrication facilities are routinely producing devices having 0.13 µm feature sizes, and tomorrow's facilities soon will be producing devices having even smaller feature sizes. In addition, integrated circuits are being layered or stacked with ever decreasing insulating thickness between each circuitry layer.

In the production of advanced integrated circuits that have minimum feature sizes of 0.13 µm and below, problems of RC delay, power consumption, and crosstalk become significant. For example, device speed is limited in part by the RC delay which is determined by the resistance of metals used in the interconnect scheme, and the dielectric constant of insulating dielectric materials used between metal interconnects. In addition, with decreasing geometries and device sizes, the semiconductor industry has sought to avoid parasitic capacitance and crosstalk noise caused by inadequate insulating layers in the integrated circuits. One way to achieve the desired low RC delay and higher performance in integrated circuit devices involves the use of dielectric materials in the insulating layers that have a low dielectric constant (k).

As the required value for the dielectric constant of materials is decreased due to device performance demands, there are many different types of low-k materials that are being investigated to determine whether they can perform acceptably. Most of these candidates are porous materials that can be organic materials, inorganic materials, organic compositions that might include inorganic components, and so forth. Further, ongoing investigations are exploring electron beam treatment of such films to improve their properties and/or to lower their dielectric constant. For example, such electron beam treatment can lower the dielectric constant and improve mechanical properties.

As used herein, the term electron beam or e-beam treatment refers to exposure of a film to a beam of electrons, for example, and without limitation, a relatively uniform beam of electrons. The e-beam may be scanned across a wafer, or the e-beam may be sufficiently broad to encompass a substantial portion, or the entirety, of a wafer (to achieve higher throughput processing it is advantageous to use a large-area or flood beam electron source, to expose the whole substrate simultaneously). The energy of the e-beam during the exposure is such that substantially an entire thickness of a layer of material is exposed to electrons from the e-beam, or predetermined portions of the layer beneath the surface of the layer are exposed to electrons from the e-beam. The exposure may also be accomplished in steps of varying energy to enable the whole layer, or portions of the layer to be exposed at predetermined depths.

During e-beam treatment of low-k dielectric CVD deposited films, spin-on dielectric deposited films, photoresists, and e-beam resists, and so forth, various organic and/or organo-silicon-based species may be volatilized and outgassed from the e-beam treated films—at least some of which outgassed species may deposit oil the walls of an e-beam treatment chamber. Such outgassing species include, for example, and without limitation: (a) from low-k dielectrics (SOD or CVD—organo-silicon-based films, both porous and non-porous): (Si—$CH_x$), (O—Si—$CH_x$), (O—Si—H), Si, C, and ($CH_x$); and (b) from photoresist or organic low-k films: ($CH_x$) and ($CH_x$)$_n$. In particular, these species may be adsorbed as a residue on chamber walls, on the e-beam source, and on other areas of an e-beam treatment chamber. Materials out-gassed from the film or e-beam by-products produced by the e-beam treatment may coat an electron beam source region. Over time, failing to clean the residue from an e-beam treatment apparatus may produce poor process performance, and may also produce high particle counts on wafers that are processed.

One prior art method for cleaning an e-beam treatment chamber involves using clean-wipes to wipe the chamber by hand. This is problematic because it is time consuming, and does not ensure that the chamber is clean. Another prior art method for cleaning the e-beam treatment chamber involves removing source components (i.e., the anode and the cathode) from the chamber, and then, wet cleaning them. This is problematic because it is time consuming and because residue is also formed on chamber walls.

In light of the above, there is a need to overcome one or more of the above-identified problems.

SUMMARY OF THE INVENTION

One or more embodiments of the present invention advantageously overcome one or more of the above-identified problems. In particular, one embodiment of the present invention is a method for cleaning an electron beam treatment apparatus that includes: (a) generating an electron beam that energizes a cleaning gas in a chamber of the electron beam treatment apparatus; (b) monitoring an electron beam current; (c) adjusting a pressure of the cleaning gas to maintain the electron beam current at a substantially constant value; and (d) stopping when a predetermined condition has been reached.

DETAILED DESCRIPTION

Figure 1:
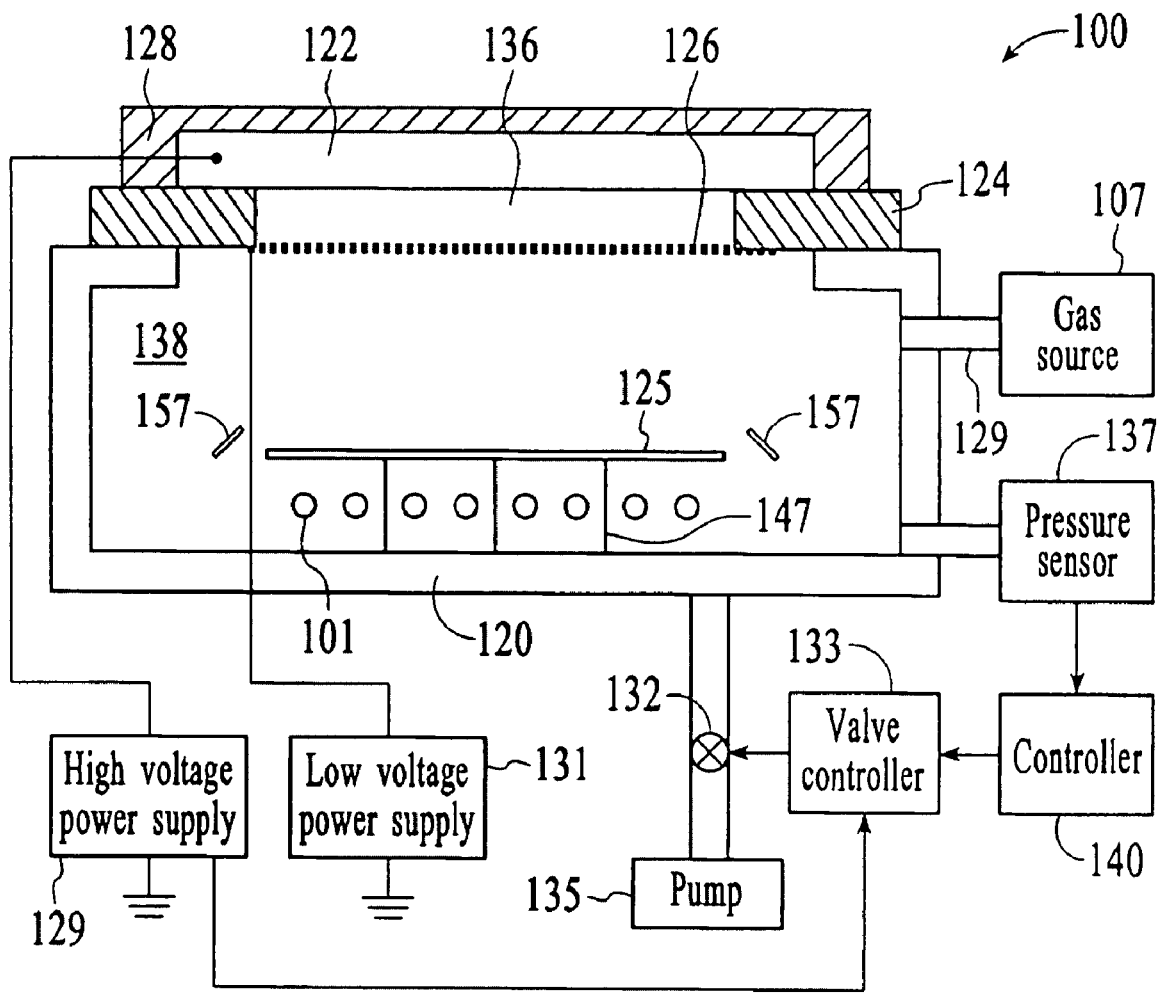
FIG. 1 shows a schematic diagram of a partial cross sectional view of an electron beam treatment apparatus that may be utilized to carry out one or more embodiments of the present invention.

One or more embodiments of the present invention relate to a method for cleaning an electron beam (e-beam) treatment apparatus such as, for example and without limitation, apparatus 100 shown in FIG. 1.

FIG. 1 shows a schematic diagram of a partial cross sectional view of large area electron beam source, electron beam treatment apparatus 100 (e-beam apparatus 100) that is available from Applied Materials, Inc. of Santa Clara, Calif. As shown in FIG. 1, e-beam apparatus 100 includes array 101 of quartz halogen lamps for heating a substrate or a wafer, which array is surrounded by heat shield 157 to provide temperature uniformity across a wafer, for example and without limitation, temperature uniformity to within at least 8° C. It should be understood that mechanisms for heating the substrate or wafer are not limited to the use of lamps. In accordance with further embodiments of e-beam apparatus 100, instead of utilizing lamp heating, the wafer or substrate may be disposed on a body that is referred to as a chuck or susceptor. In accordance with such embodiments, the chuck may be resistively heated in a manner that is well known to those of ordinary skill in the art to provide heating independent of that provided by the electron beam. In addition, the chuck may be an electrostatic check (for example, a monopolar or bipolar electrostatic chuck) to provide good contact between the wafer and the chuck. Many methods are well known to those of ordinary skill in the art for fabricating such electrostatic chucks. Further in accordance with such embodiments, a backside gas may be flown between the wafer and the chuck to enhance thermal conductivity between the two in a manner that is well known to those of ordinary skill in the art, such backside gas being flown in one or more zones depending on the need for controlling temperature uniformity. Still further in accordance with such embodiments, a cooling liquid may be flown inside the chuck to be able, for some treatment mechanisms, to reduce the temperature of the wafer in light of heating provided by the electron beam. Many methods are well known to those of ordinary skill in the art for flowing a cooling liquid through a chuck. Indeed, it should be understood that embodiments of the present invention are not limited to the use of the e-beam apparatus shown in FIG. 1, and that further embodiments of the present invention may be fabricated utilizing any one of a number of other electron beam apparatus for developing suitable e-beams.

As further shown schematically in FIG. 1, substrate 125 is held over array 101 of lamps by pins 147, for example and without limitation, three (3) pins. In addition, such pins may include one or more thermocouples (not shown) to enable the temperature of substrate 125 to be monitored and controlled in accordance with any one of a number of mechanisms that are well known to those of ordinary skill in the art, for example and without limitation, using a chamber controller. In further addition, one of such pins may include a conductor to enable substrate 125 to be grounded. Pins 147 may be raised or lowered in a conventional matter, for example and without limitation, utilizing a lift plate assembly (not shown) to enable a conventional wafer transport robot and blade structure to move substrate 125 into and out of e-beam treatment apparatus 100.

Apparatus 100 is a type of e-beam apparatus like that disclosed in U.S. Pat. No. 5,003,178 (the '178 patent). Apparatus 100 utilizes various gases and operates at various values of cathode voltage, gas pressure, and working distance (i.e., a distance between the cathode and anode in a generation and acceleration region of the electron beam treatment apparatus, to be described below). As will be described below, such gases and appropriate values of cathode voltage, gas pressure, and working distance may be determined readily by one of ordinary skill in the art without undue experimentation. Co-pending patent application entitled "Improved Large Area Source for Uniform Electron Beam Generation" filed Nov. 21, 2002, Ser. No. 10/301,508 (which co-pending patent application and the present patent application are commonly assigned) and the '178 patent are incorporated by reference herein.

As shown in FIG. 1, e-beam treatment apparatus 100 includes vacuum chamber 120; large-area cathode 122 (for example, and without limitation, a cathode having an area in a range from about 4 square inches to about 700 square inches); and anode 126. As further shown in FIG. 1, anode 126 is disposed between substrate 125 (located in ionization region 138) and cathode 122. Anode 126 is disposed at a working distance from cathode 122 that is determined in a manner to be described below.

As further shown in FIG. 1, electron source 100 further includes: (a) high-voltage insulator 124 that is disposed between cathode 122 and anode 126 and is operative to isolate cathode 122 from anode 126; (b) cathode cover insulator 128 that is located outside vacuum chamber 120 to provide electrical protection for users; (c) valved gas manifold 127 that has an inlet which is fabricated in accordance with any one of a number of methods that are well known to those of ordinary skill in the art to provide a mechanism for admitting gas into vacuum chamber 120 at one or more various input rates from source 107; (d) valve controller 133 that operates in response to signals from pressure sensor 137 and real time chamber controller 140 in a manner to be described below; (e) throttle valve 132 that operates in response to a signal from throttle valve controller 133 to control exhaust from vacuum chamber 120, (f) vacuum pump) 135 (vacuum pump 135 may be any one or a number of commercially available vacuum pumps capable of pumping vacuum chamber 120 from atmospheric pressure to a pressure in a range between about 1 mTorr to about 200 mTorr such as, for example and without limitation, a turbo pump) that exhausts gas from chamber 120 through throttle valve 132 to control pressure inside vacuum chamber 120; (g) variable, high-voltage power supply 129 that is connected to cathode 122, and which supplies a signal to throttle valve controller 133 that provides a measure of e-beam current impinging upon substrate 125; and (h) variable, low-voltage power supply 131 that is connected to anode 126.

As shown in FIG. 1, a high voltage (for example, a negative voltage between about −500 V and about −30 KV or higher) is applied to cathode 122 from variable, high-voltage power supply 129. In accordance with one embodiment of e-beam apparatus 100, high-voltage power supply 129 may be a Bertan Model #105-30R power supply manufactured by Bertan of Hicksville, N.Y., or a Spellman Model #SL30N-1200X 258 power supply manufactured by Spellman High Voltage Electronics Corp. of Hauppage, N.Y. Variable, low-voltage power supply 131 (for example, a d.c. power supply capable of sourcing or sinking current) is utilized to apply a voltage to anode 126 that is positive relative to the voltage applied to cathode 122. For example, the voltage applied to anode 126 may range from about 0 V to about −500 V. In accordance with one embodiment of e-beam apparatus 100, low-voltage power supply 131 may be an Acopian Model #150PT12 power supply available from Acopian of Easton, Pa.

A wafer or substrate to be treated, such as substrate 125, is placed on pins 147. In accordance with one or more embodiments of e-beam apparatus 100, substrate 125 may be heated by a heating apparatus (for example and without limitation, a resistive heater disposed within a wafer or substrate holder in accordance with any one of a number of methods that are well known to those of ordinary skill in the art, or one or more infrared lamps such as array 101 of quartz halogen lamps) disposed to heat substrate 125 in accordance with any one of a number of methods that are well known to those of ordinary skill in the art. Some of the radiation output from lamps in an embodiment that utilizes lamps to provide heating may be reflected within chamber 120 to anode 126. Accordingly, in accordance with one or more such embodiments of e-beam apparatus 100, an internal portion of vacuum chamber 120 may be bead blasted, darkened, roughened, or anodized to reduce the coefficient of reflection of the internal portion of the chamber to be less than about 0.5. In this manner, a portion of the radiation output from the lamps may be absorbed by the internal portion of vacuum chamber 120.

Figure 3:
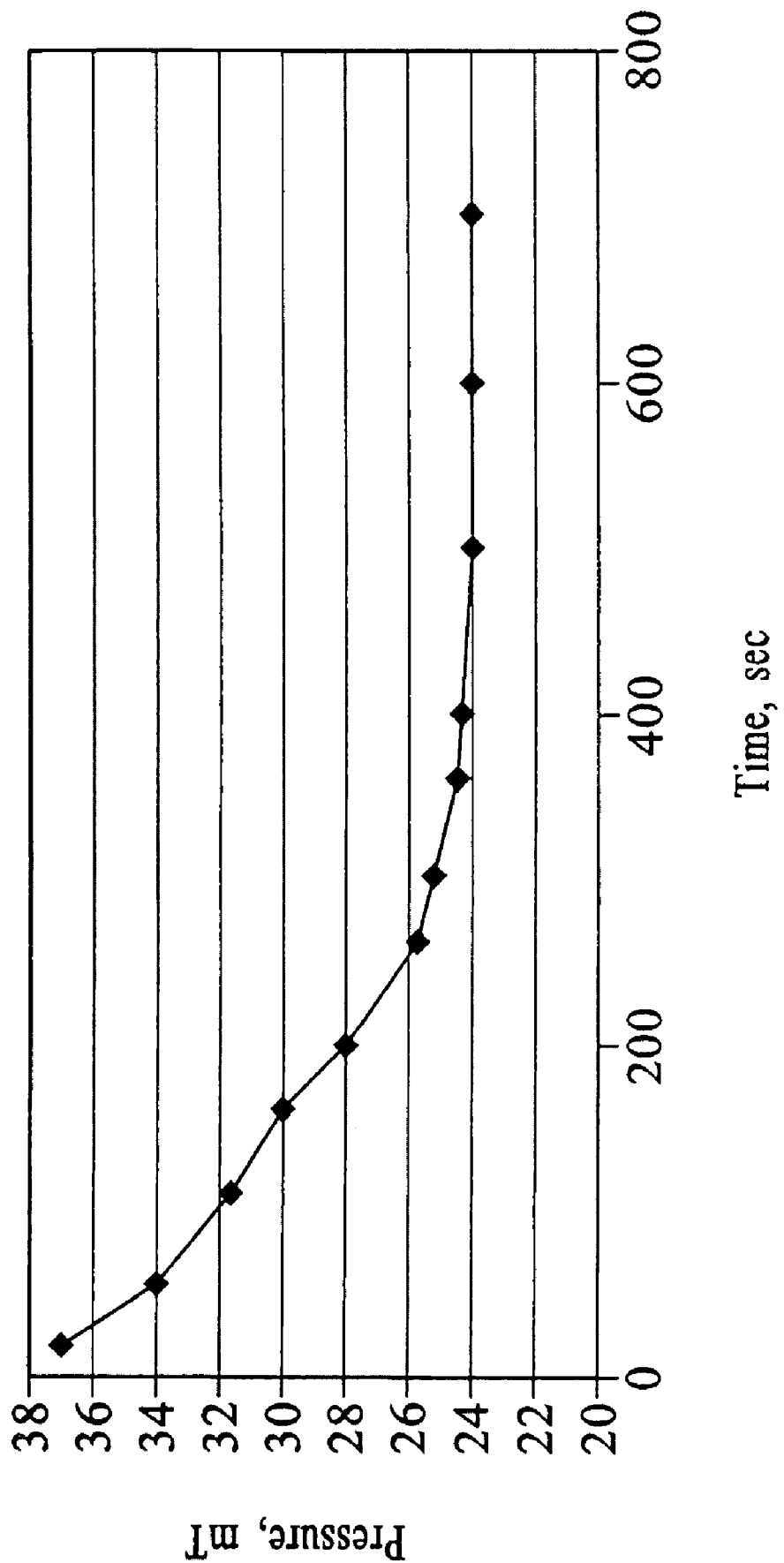
FIG. 3 shows a graph of chamber pressure over time as an $O_2$ chamber clean process is carried out in accordance with one embodiment of the present invention wherein chamber pressure is varied so as to maintain a substantially constant electron beam current.

Wafer 125 may be placed at a relatively large distance, such as, for example, and without limitation, 10 to 30 mm, from anode 126 to prevent electrons from casting an image of anode 126 on wafer 125. In addition, irradiation of wafer 125 may further entail sweeping the electron beam back and forth across wafer 125 by using, for example and without limitation, a time-varying magnetic field produced by deflection coils surrounding vacuum chamber 120 as shown in FIG. 3 of the '178 patent.

In accordance with one or more embodiments of e-beam apparatus 100, anode 126 may be fabricated (in whole or a surface thereof) from an electrically conductive material such as, for example, and without limitation, Al, Ti, Ni, Si, Mo, graphite, W, Co, and alloys of the foregoing. For treating films at relatively high temperatures, for example, temperatures in a range between about 200° C. and about 600° C., aluminum may provide a more suitable material than graphite. For example, aluminum generally has a higher thermal conductivity than graphite, and as a consequence, an anode formed from aluminum may bow less at high temperatures than one formed from graphite. In addition, aluminum has a lower emissivity than graphite, and this leads to lower heat transfer to the anode by radiation (for example, from wafer 125). In further addition, aluminum has a lower sputtering yield than graphite, thereby resulting in less contamination on wafer 125. It should be noted that in addition to anode 126 being made from aluminum, cathode 122 and vacuum chamber 122 may also be made from aluminum. However, the surface of cathode 122 may also be fabricated from Al, Ti, Ni, Si, Mo, graphite, W, Co and alloys of the foregoing.

Anode 126 may be, for example, and without limitation, a grid, a mesh or a plate having an array of holes disposed therethrough. For example, in accordance with one or more embodiments of e-beam apparatus 100, the size of the holes may be varied to compensate for a decrease in beam intensity that sometimes occurs at an edge of anode 126. In this manner, a more diametrically uniform electron beam may be generated. For example, in accordance with one or more embodiments of e-beam apparatus 100, anode 126 comprises 37,500 holes with four concentric zones of different hole diameter, providing approximately 58% open area. In using such an embodiment, electron beam uniformity may be tuned by hole diameter in each zone, with larger diameter holes disposed at the edge of at anode 126 where the tuning entails using film shrinkage uniformnity. Examples for the array of holes and methods for making the holes are described in more detail in U.S. Pat. No. 6,407,399 which patent is incorporated by reference herein.

In some applications, it is desirable to provide constant electron beam current during treatment. The electron beam current may vary because, among other things, processing may cause deposition of outgassed treatment by-products on chamber walls, the anode, and the cathode. Such deposition on the anode and cathode limit or reduce secondary electron yield, and source efficiency may begin to drop (i.e., the efficiency of electron emission from the source may decrease). One method of counteracting the drop in source efficiency entails increasing the chamber pressure during the e-beam treatment process. This is effective because raising the chamber pressure produces more ions in the region between the anode and the cathode, and the increased number of ions overcomes the decrease in source efficiency because there are more ions available to strike the cathode. In fact, as will be described in detail below, one indicium of residue build-up includes an increase in chamber pressure that is required to maintain an electron beam current at a substantially constant value.

Apparatus 100 shown in FIG. 1 may provide constant electron beam current during treatment as follows: (a) high voltage power supply 129 and low voltage power supply 131 are set to predetermined output voltage values for a particular application (typically, the voltages are set in response to input from real time chamber controller 140 in a conventional manner); (b) valved gas manifold 127 is set to provide a predetermined value of gas flow for a particular application (typically, the setting of a valve is set in response to input from real time chamber controller 140 in a conventional manner); (c) throttle valve controller 133 sends a signal to throttle valve 132 to cause it to provide a predetermined gas pressure in vacuum chamber 120 for a particular application (typically, throttle valve controller 133 operates in response to input from real time chamber controller 140 in a conventional manner); (d) real time controller 140 sends a signal to throttle valve controller 133 that represents a "current set point" for a particular application; (e) high voltage power supply 129 sends a signal to throttle valve controller 133 that represents a measure of electron beam current; and (f) throttle valve controller 133 causes the measure of electron beam current to match the "current set point" by sending signals to throttle valve 132 to open it or close it to control chamber pressure so as to maintain constant beam current. For example and without limitation, in accordance with one embodiment of apparatus 100, throttle valve 132 has a response time for opening or closing of about 130 ms. Thus, as residues collect, and the efficiency of electron production goes down, chamber pressure is increased to provide a constant electron beam. In accordance with one or more embodiments, the measure of electron beam current is determined by estimating that, for example and without limitation, a predetermined number of electrons produced at cathode 122 do not travel through anode 126 (for example, anode 126 may include a pattern of holes that transmits only ~60% of the electrons impinging thereon from cathode 122), and by estimating that a predetermined number of electrons (for example and without limitation, 10%) transmitted through anode 126 do not strike substrate 125 because the area anode 126 may be larger (for example and without limitation, 10% larger) than the area of substrate 125. As such, in accordance with one or more embodiments, the measure of electron beam current is determined by estimating that ~40% of the electrons leaving cathode 122 (measured by high voltage power supply 129) reach substrate 125. Such estimates may be experimentally verified by measurements utilizing graphite wafers or by measurements utilizing a Faraday cup in accordance with any one of a number of methods that are well known to those of ordinary skill in the art.

Figure 2:
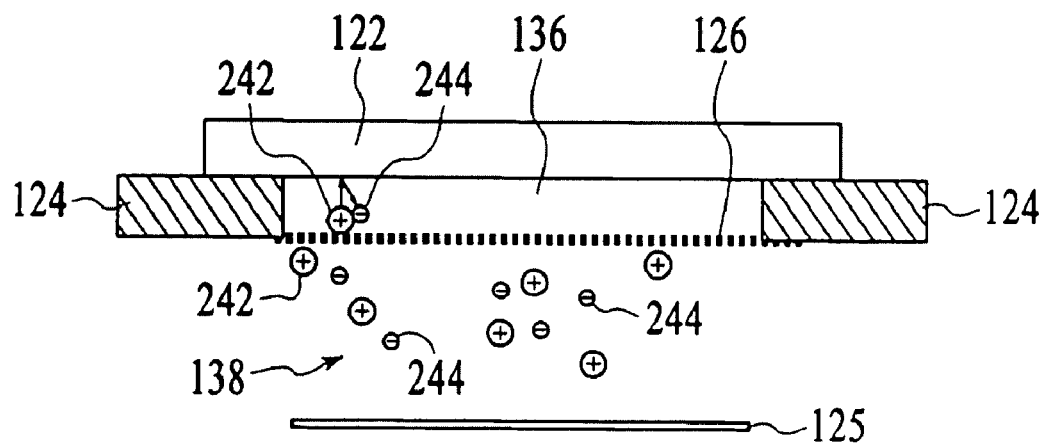
FIG. 2 shows a fragmentary view of the electron beam treatment apparatus of FIG. 1 which helps to illustrate some details of its operation.

FIG. 2 shows a fragmentary view of electron beam treatment apparatus 100 of FIG. 1 which helps to illustrate some details of its operation. To initiate electron emission in electron beam treatment apparatus 100, gas in ionization region 138 between anode 126 and wafer 125 must become ionized. In accordance with one or more embodiments of the present invention, the gas may include one or more of, for example, and without limitation, helium, argon, nitrogen, hydrogen, oxygen, ammonia, neon, krypton, and xenon. The step of ionizing the gas may be initiated by naturally occurring gamma rays, or it may be initiated by a high voltage spark gap disposed inside vacuum chamber 120 in accordance with any one of a number of methods that are well known to those of ordinary skill in the art.

Anode 126 is negatively biased by a voltage in a range, for example, from about 0 V to about −500 V that is applied thereto from low-voltage power supply 131. Once ionization is initialized, as shown in FIG. 2, positive ions 242 are attracted toward negatively biased anode 126. These positive ions 242 pass through holes in anode 126 into electron generation and acceleration region 136 between cathode 122 and anode 126. In region 136, positive ions 242 are accelerated toward cathode 122 as a result of a voltage (for example, a voltage in a range from about −500 V to about −30 KV or higher) that is applied thereto from high-voltage power supply 129. Upon striking the surface of cathode 122, positive ions 242 produce electrons 244 that are accelerated back toward anode 126. Some of electrons 244 strike anode 126, but many pass through anode 126, and continue on to impinge upon wafer 125. In addition, some of electrons 244 ionize gas molecules in ionization region 138.

The working distance between cathode 122 and anode 126 may be set to any value that is consistent with obtaining no arcing or breakdown in generation and acceleration region 136. This enables the presence of ions in generation and acceleration region 136 to be controlled by voltage applied to anode 126. In turn, this enables electron emission, and hence, electron beam current, to be controlled continuously from small currents to large currents by varying the voltage applied to anode 126. In addition, electron emission, and hence, electron beam current, can also be controlled by using throttle valve 132 to adjust the gas pressure in vacuum chamber 120 (i.e., raising or lowering gas pressure, raises or lowers, respectively, the number of ions in ionization region 138 and generation and acceleration region 136). As a result, in operation, one can utilize: (a) values of cathode voltage that are small enough to be useful in treating thin films; (b) values of gas pressure that are high enough to sustain electron beam current at such small values of cathode voltage, and (c) values of working distance that provide sufficient working tolerances to mitigate, for example, and without limitation, mechanical problems that might be caused by heating of chamber elements such as anode 126.

One can determine appropriate values of operation by routine experimentation as follows. First, chose a convenient working distance for the electron beam treatment apparatus. Next, select a value of cathode voltage that is determined by the energy of electrons required to treat a wafer. Next, while measuring the electron beam current (using, for example, a current detector disposed in series with high-voltage power supply 129), vary the gas pressure to sustain an effective, uniform electron beam. The current is measured to determine values of current that provide useful throughput (for example, and without limitation, electron beam current may range from about 1 mA to about 40 mA), and to ensure that the values of cathode voltage, gas pressure, and working distance used do not result in arcing or breakdown in generation and acceleration region 138 (breakdown may be evidenced by a faint plasma or arcing which can also be observed by voltage or current spiking at the cathode).

As shown in FIG. 1, array of lamps 101 irradiate and heat wafer or substrate 125, thereby controlling its temperature. Since wafer 125 is in a vacuum environment, and is thermally isolated, wafer 125 can be heated or cooled by radiation. If the lamps are extinguished, wafer 125 will radiate away its heat to the surrounding surfaces and gently cool. Wafer 125 is simultaneously heated by the lamps and irradiated by the electron beam throughout the entire process. For example, in accordance with one embodiment, array 101 of infrared quartz halogen lamps are on continuously until the temperature of wafer 125 reaches a process operating temperature. The lamps are thereafter turned off and on at a predetermined, and perhaps, varying duty cycle to control the wafer temperature.

In accordance with one or more embodiments of the present invention, a chamber clean process entails use of the e-beam source to generate an electron beam that, in turn, energizes a cleaning gas in the e-beam chamber. In fabricating such embodiments of the present invention, appropriate values of cathode voltage, electron beam current, gas pressure, and temperature for a chamber having a particular working distance between the cathode and anode may be determined routinely by one of ordinary skill in the art without undue experimentation by keeping in mind the following considerations. First, we have discovered that it is easier to remove organic or carbon-rich residues than high density residues. Thus, for easier to remove residues, one might utilize lower values of cathode voltage such as, for example and without limitation, a value of cathode voltage of about 1 KeV. However, for harder to remove residues one might utilize higher values of cathode voltage such as, for example and without limitation, about 10 KeV or above. However, high values of cathode voltage may cause sputtering of the anode. Second, the value of electron beam current is an important factor in determining how quickly the chamber is cleaned. As such, one might utilize a high electron beam current such as, for example and without limitation, about 10 mA or above to provide a rapid clean. Third, a cleaning gas, for example, and without limitation, $O_2$, is provided at an initial chamber pressure that is sufficient to enable the chosen value of electron beam current to be produced in light of the chosen values of cathode voltage and ambient gas. For example and without limitation, a pressure of about 40 mTorr may be appropriate for a cathode voltage of about 1 KeV, an electron beam current of about 10 mA, and a cleaning gas of $O_2$. Fourth, we have heated the chamber in a number of different ways for cleaning (in general, higher temperatures cause more rapid cleaning). For example: (a) in accordance one embodiment, we have heated the chamber (utilizing array 101 of lamps) prior to cleaning, and then turned the lamps off during cleaning; (b) in accordance with another embodiment, we have heated the chamber during cleaning (utilizing array 101 of lamps set at, for example, at about 35% of maximum power); and (c) in accordance with still another embodiment, we have heated the chamber to a fixed temperature and maintained that temperature by turning the lamps on and off as needed during cleaning.

FIG. 3 shows a graph of chamber pressure over time as an $O_2$ chamber clean process is carried out in accordance with one embodiment of the present invention wherein pressure is varied so as to maintain a substantially constant electron beam current. As shown in FIG. 3, after about 375 sec, the chamber pressure required to maintain a constant electron beam current had fallen to a relatively constant value. In accordance with one or more embodiments of the present invention, reaching and maintaining a relatively constant value of chamber pressure for a predetermined length of time (for example and without limitation, 5 sec) is taken an indication of reaching one endpoint of the method. Although the initial results indicate that the anode is substantially clean at the one endpoint, the cathode may still have some residue remaining. In accordance with one or more such embodiments of the present invention wherein the electron beam energizes a cleaning gas, for example and without limitation, $O_2$, it is believed that the source is cleaned by ions of the cleaning gas sputtering residue deposited on the cathode and the anode. In addition, and advantageously in accordance with one or more further embodiments, one can track the progress of such embodiments by monitoring chamber pressure. That is, as the source becomes clean, it operates at a lower pressure for a given electron beam current because it is believed that a clean source produces electrons more efficiently than a dirty one.

FIG. 3 shows that chamber pressure required to provide a substantially constant electron beam current drops as the chamber is cleaned, and as a result, chamber pressure can be monitored during the cleaning process to provide one endpoint. In addition, at least for organic species in residues, $O_2$ appears to provide a suitable chamber cleaning gas. Alternatively, suitable chamber cleaning gases, at least for organic species in the residue, include an oxygen-based cleaning gas such as, for example and without limitation, ozone, NO, $H_2O$, and so forth, and combinations of one or more of these gases. However, for residues that include inorganic species, a fluorine-based (F-based) cleaning gas should be used such as, for example and without limitation, $NF_3$, $F_2$, $CF_4$, $C_2F_6$, $C_3F_8$, $SF_6$, and so forth, and combinations of one or more of these gases. Alternatively, a combination of F-based/O-based chemistries can also be used such as, for example and without limitation, $NF_3$, $F_2$, $CF_4$, $C_2F_6$, $C_3F_8$, $SF_6$, $O_2$, ozone, NO, $H_2O$, and combinations of one or more of these cleaning gases. Such cleaning gases may also be used along with optional additives or carrier gases such as, for example, and without limitation, He, Ar, and $N_2$, and combinations of one or more of these additives.

Note that in accordance with one or more alternative embodiments of the present invention, chamber pressure does not change over time so as to maintain a constant electron beam current as described above. For example, in accordance with one or more such alternative embodiments of the present invention, a high pressure chamber clean process utilizes, for example and without limitation, a gas pressure of about 1 Torr or more. In accordance with one such alternative embodiment, cathode voltage may be in a range from about 1 to about 2 KeV (even higher cathode voltages may be utilized for harder to clean residues) wherein a cleaning gas may be an oxygen-based cleaning gas such as, for example and without limitation, $O_2$, ozone, NO, $H_2O$, and so forth, and combinations of one or more of these gases; the cleaning gas may be a fluorine-based cleaning gas such as, for example and without limitation, $NF_3$, $F_2$, $CF_4$, $C_2F_6$, $C_3F_8$, $SF_6$, and so forth, and combinations of one or more of these gases; or the cleaning gas may be a combination of such oxygen-based and fluorine-based cleaning gases. Such cleaning gases may also be used along with optional additives or carrier gases such as, for example, and without limitation, He, Ar, and $N_2$, and combinations of one or more of these additives. Appropriate values of electron beam current and temperature utilized may be determined in for a chamber having a particular working distance between the cathode and anode may be determined routinely by one of ordinary skill in the art without undue experimentation by keeping in mind the considerations set forth above relating to these parameters.

In accordance with one or more further embodiments of the present invention, a method for cleaning an electron beam treatment chamber entails utilizing a remote plasma source (although use of an in-situ plasma source is also possible) to form a plasma of a cleaning gas. The use of a remote plasma source is advantageous because, among other things, it requires fewer changes to apparatus 100 shown in FIG. 1, which changes might be required to facilitate striking a capacitively or inductively coupled plasma for an in-situ plasma source other than the above-described use of the e-beam treatment chamber source itself. However, it should be clear to those of ordinary skill in the art how to make appropriate changes to effectuate an in-situ plasma source.

In accordance with one or more such embodiments of the present invention that utilize a remote plasma source, an RF plasma source or a microwave plasma source would generate free radicals that would be directed to flow into the treatment chamber to interact with residue therewithin to create volatile by-products that would be pumped from the chamber. The remote plasma source may be a microwave generated remote plasma source which is well known to those of ordinary skill in the art, or it may be an RF inductively-coupled remote plasma source which is well known to those of ordinary skill in the art. The particular conditions of microwave or inductive RF power and pressure may be determined routinely by one or ordinary skill in the art without undue experimentation. In addition, the power and pressure used for various sized chambers may also be determined routinely by one or ordinary skill in the art without undue experimentation. In further addition, the frequency of cleaning process would depend on the extent of residue generated during the e-beam treatment process.

In accordance with one or more such embodiments of the present invention, a cleaning gas may be a fluorine-based cleaning gas such as, for example and without limitation, $NF_3$, $F_2$, $CF_4$, $C_2F_6$, $C_3F_8$, $SF_6$, and so forth, and combinations of one or more of these gases; an oxygen-based cleaning gas such as, for example and without limitation, $O_2$, ozone, NO, $H_2O$, and so forth, and combinations of one or more of these gases; or a combination of such oxygen-based and fluorine-based cleaning gases. Such cleaning gases may also be used along with optional additives or carrier gases such as, for example, and without limitation, He, Ar, and $N_2$, and combinations of one or more of these additives. In accordance with one or more such embodiments, fluorine radicals in a plasma formed of a gas comprising a fluorine-based cleaning gas react with silicon-containing residues in the e-beam chamber to form volatile species such as, for example and without limitation, $SiF_4$ which can be pumped out of the chamber. In accordance with one or more further embodiments of the present invention, different cleaning gases may be utilized to remove organic residues generated during e-beam treatment of photoresist materials or organic dielectrics (for example, e-beam treatment of low-k CVD films or SOD formulations containing removable pendant groups or containing organic porogens or surfactants designed to decompose and generate porosity). For example and without limitation, for residues formed in treating low K dielectric films, a cleaning gas may include one or more of $O_2$, ozone, NO, $N_2$, $H_2$, $H_2O$, and combinations of one or more of these cleaning gases, along with optional additives or carrier gases such as, for example, and without limitation, He, Ar, and $N_2$ and combinations of one or more of these additives.

In accordance with one or more embodiments of the present invention for cleaning a treatment chamber contaminated with organo-silicon-based residue, a cleaning process may involve forming an $NF_3$ plasma in a microwave remote plasma source at a pressure in a range from about 0.5 Torr to about 10 Torr, and at a microwave source power in a range from about 0.5 KW to about 2.5 KW. If the source is an RF inductively-coupled power source such as for example, an inductively coupled coil operating at about 13.56 Mhz, the pressure and power operating regimes may have to be adjusted, for example, by using higher power levels.

In accordance with one or more embodiments of the present invention utilizing a remote plasma source, radicals formed in a remote plasma chamber may be directed to enter the chamber through gas inlet tubes directed to flow gas into an area above the wafer. However, in accordance with other embodiments, the radicals may be directed to enter the chamber through gas inlet tubes directed to flow gas into other areas in which residue may build up, or into other areas in combination with the area above the wafer.

In accordance with one or more embodiments of the present invention, a portable remote plasma cleaning module (with everything including source gas transported as a unit on a cart for example) would be used to generate radicals which are directed into the e-beam treatment chamber to clean residues. In accordance with one or more such embodiments, a blank-off flange port would be added to the e-beam treatment chamber so that the radicals produced by the remote plasma cleaning module could enter the e-beam treatment chamber to be cleaned on a "line of sight" path.

Those skilled in the art will recognize that the foregoing description has been presented for the sake of illustration and description only. As such, it is not intended to be exhaustive or to limit the invention to the precise form disclosed.

What is claimed is:

1. An apparatus for cleaning a chamber of an electron beam treatment apparatus, the apparatus comprising:
   (a) a high voltage power supply coupled to an electron beam source for generating an electron beam current though a cleaning gas to energize the cleaning gas in the chamber of the electron beam treatment apparatus;
   (b) a current detector coupled to the high voltage power supply for monitoring a value corresponding to the electron beam current;
   (c) a pressure sensor coupled to the chamber that produces signals corresponding to a pressure of the cleaning gas in the chamber;
   (d) a real time controller that receives the signals from the pressure sensor and produces a substantially constant value of the electron beam current in response to the signals from the pressure sensor; and
   (e) a valve controller that receives the value from the current detector and the substantially constant value from the real time controller and is further coupled to a valve that controls the pressure of the cleaning gas in the chamber, wherein the valve controller controls the valve so as to adjust the pressure and thereby maintain the substantially constant value of the electron beam current,
   wherein the flow of cleaning gas is stopped when the cleaning gas pressure becomes substantially constant for a predetermined length of time.

2. The apparatus of claim 1 wherein the cleaning gas comprises an oxygen-based gas.

3. The apparatus of claim 2 wherein the oxygen-based gas comprises one or more of $O_2$, ozone, NO, and $H_2O$.

4. The apparatus of claim 1 wherein the cleaning gas comprises a fluorine-based gas.

5. The apparatus of claim 4 wherein the fluorine-based gas comprises one or more of $NF_3$, $F_2$, $CF_4$, $C_2F_6$, $C_3F_8$ and $SF_6$.

6. The apparatus of claim 2 wherein the cleaning gas pressure of about 1 Torr or greater is maintained in the chamber.

7. The apparatus of claim 4 wherein the cleaning gas pressure of about 1 Torr or greater is maintained in the chamber.

8. The apparatus of claim 1, wherein the predetermined length of time is about 5 seconds.

9. The apparatus of claim 1, wherein the electron beam source is adapted to generate an electron beam current of about 10 mA or above.

10. The apparatus of claim 1, further comprising:
    (e) heaters for heating the chamber during cleaning.

11. The apparatus of claim 1, wherein the cleaning gas pressure ranges from about 0.5 Torr to 10 Torr.

12. The apparatus of claim 11, wherein the cleaning gas comprises $NF_3$.

* * * * *

UNITED STATES PATENT AND TRADEMARK OFFICE
CERTIFICATE OF CORRECTION

PATENT NO.       : 7,790,583 B2
APPLICATION NO.  : 11/925611
DATED            : September 7, 2010
INVENTOR(S)      : Demos et al.

It is certified that error appears in the above-identified patent and that said Letters Patent is hereby corrected as shown below:

IN THE SPECIFICATION

In Column 1, Line 19, delete "limitation. Semiconductor" and insert -- limitation, semiconductor --, therefor.

In Column 2, Line 14, delete "oil" and insert -- on --, therefor.

In Column 4, Line 34, delete "120, (f) vacuum pump)" and insert -- 120; (f) vacuum pump --, therefor.

In Column 5, Line 60, delete "uniformnity." and insert -- uniformity. --, therefor.

In Column 7, Line 46, delete "voltage," and insert -- voltage; --, therefor.

Signed and Sealed this
Tenth Day of April, 2012

David J. Kappos
*Director of the United States Patent and Trademark Office*